331-98

SEARCH ROOM

Oct. 11, 1966

B. F. GREGORY 3,278,859

DIELECTRIC LOADED CAVITY OSCILLATOR

Filed Oct. 24, 1963

INVENTOR
BENJAMIN F. GREGORY

BY Blair and Buckles
ATTORNEYS 3,278,859
Patented Oct. 11, 1966

3,278,859

DIELECTRIC LOADED CAVITY OSCILLATOR

Benjamin F. Gregory, Tampa, Fla., assignor to Trak Microwave Corporation, Tampa, Fla.

Filed Oct. 24, 1963, Ser. No. 318,731
7 Claims. (Cl. 331—98)

Figures 1, 2:
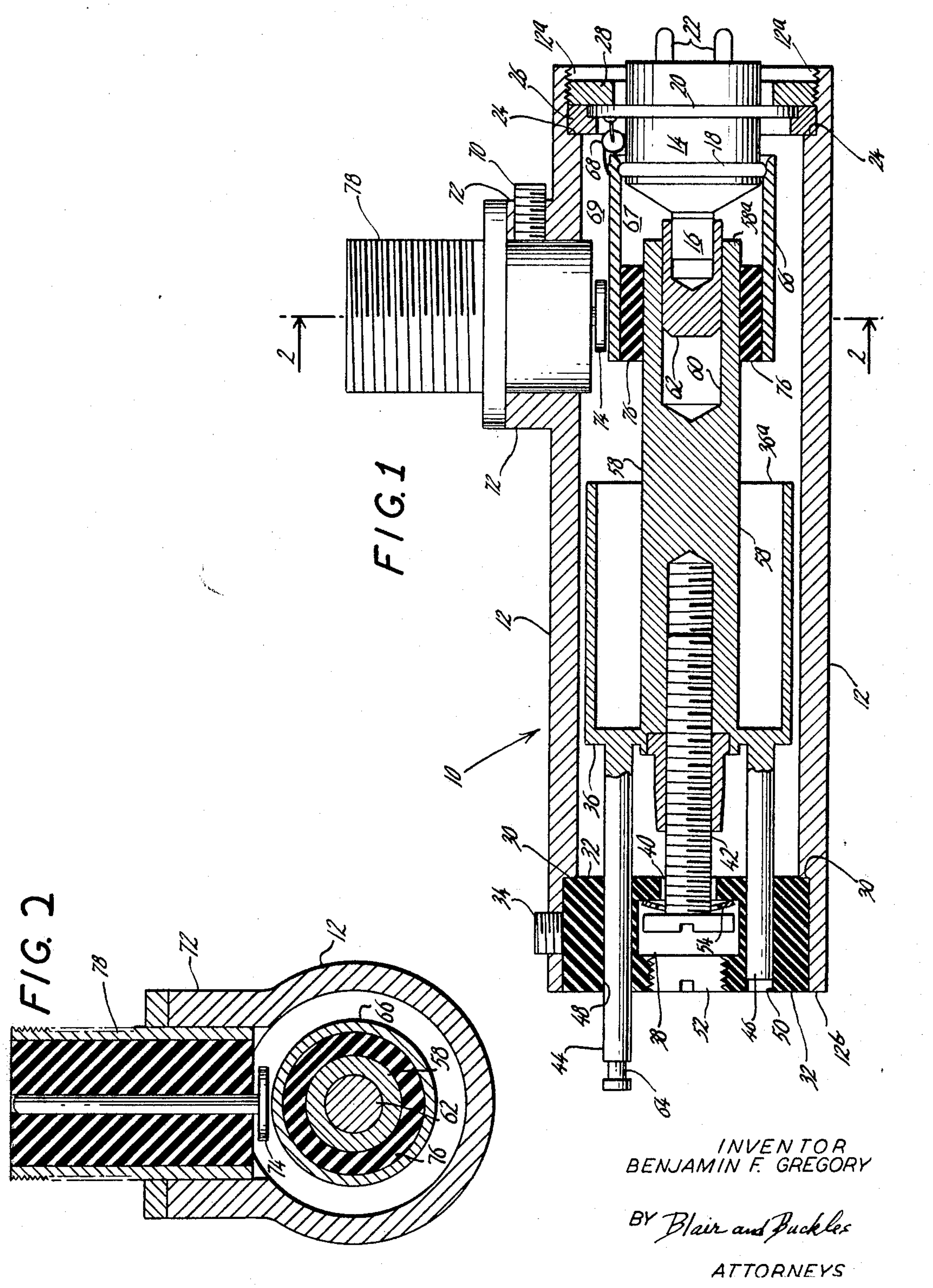

This invention relates to the art of microwave oscillators. More particularly, this invention relates to an improved microwave oscillator of the re-entrant type capable of operating at ultra-high frequencies with greatly improved efficiency of operation. The invention has particular but not limited application to ultra-high frequency triode oscillators of extremely small physical size capable of supplying increased power outputs in either the pulsed or continuous wave operational modes.

Microwave oscillators of the re-entrant type employ a co-axial transmission line or cavity having a vacuum tube positioned within the cavity at one end thereof. The plate and the cathode of the tube are electrically connected to the inner and outer conductors of the co-axial cavity to energize the tube. The grid is contacted by a conducting sleeve extending co-axially between the inner and outer conductors. This grid sleeve functions to couple electrical energy from the plate back to the grid in proper phase and amplitude for oscillatory signal regeneration.

In pushing re-entrant type oscillators to higher operating frequencies, substantial redesigning of the physical dimensions of the co-axial lines is required. These physical dimensions must be reduced in order to achieve resonance at these higher frequencies. Generally, it requires extensive experimentation with various combinations of physical sizes for the various parts of the oscillator in order to achieve satisfactory oscillatory operation in a desired frequency range. In other words, oscillator design for a particular operating frequency is largely an empirical proposition.

At frequencies in excess of 4000 megacycles, the design problems encountered in a re-entrant type triode oscillator become particularly acute. The wavelength of the electrical energy at this frequency is less than three inches in length. Thus the physical dimensions of the various parts of the oscillator become extremely critical since even a small change in a physical dimension is a significant fraction of a wavelength.

It is appreciated by those skilled in the art that, in order to achieve satisfactory oscillatory operation, the phase and the amplitude of the electrical energy fed back to the grid of the tube must be in proper relation to the phase and amplitude of the energy developed at the plate. It has been discovered that, in high frequency designs, optimum phase relationship and optimum amplitude relationship of the feedback signal are not readily achieved by a single design. In other words, the co-axial lines of a re-entrant oscillator may be designed to achieve an optimum feedback amplitude relationship, but the feedback phase relationship is then substantially less than optimum. The converse situation may also be obtained.

At frequencies below 4000 megacycles, this incongruity of feedback amplitude and phase relationship may be satisfactorily resolved by resorting to a compromise design. The feedback signal amplitude and phase relationships, by appropriate oscillator design, are each established at somewhat less than optimum values to achieve tolerable oscillatory operation. The resulting reduction in efficiency and output power are necessary sacrifices.

However, at frequencies in excess of 4000 megacycles, no tolerable design compromise has been found to exist for extremely small oscillators (less than one inch in diameter) consistent with acceptable operating efficiency and output power. Since the wavelength of the electrical energy at these elevated frequencies is small, small changes in physical dimensions result in significant changes in the characteristics of the feedback signals. Accordingly, slight departures from the physical design for optimum feedback amplitude relationship, for example, do not produce sufficient improvement in the feedback phase relationship to obtain proper oscillatory operation. A sufficient departure from this optimum design to produce a satisfactory phase relationship results in a wholly unsatisfactory feedback amplitude relationship.

It is therefore an object of the present invention to provide a re-entrant type triode oscillator capable of operating at frequencies in excess of 4000 megacycles.

A further object is to provide a re-entrant type oscillator design capable of high frequency operation with improved efficiency and output power.

A principal object of the present invention is to provide a high frequency, re-entrant type oscillator design which is optimumly matched in that the relationship of the characteristics of the feedback signal to the signal characteristics at the place of the oscillator tube is optimized.

A more specific object is to provide a re-entrant type triode oscillator of high frequency operation wherein the optimum relationship of feedback amplitude and phase necessary to achieve optimum efficiency of operation and output power is substantially obtained.

Other objects of the invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings, in which:

FIGURE 1 is a longitudinal cross-sectional view of a re-entrant type triode oscillator embodying my invention; and FIGURE 2 is a cross-sectional view taken along the line 2—2 of FIGURE 1.

The same reference numerals identify corresponding parts in both figures.

In general, my invention provides for the inclusion of a dielectric load in one of the co-axial lines of a re-entrant type triode oscillator to vary the electrical length of the co-axial line without necessarily varying the physical length of the line. This dielectric load may consist of a slug of dielectric material having properly selected dielectric characteristics and physical dimensions to compensate for the shortcomings in the physical design of the oscillator which would otherwise prevent the achievement of an optimumly matched operating condition.

Accordingly, the oscillator may be dimensionally designed to obtain the optimum value of feedback signal amplitude and, at the same time, a discretely dimensioned dielectric slug having an appropriate dielectric constant may be inserted in one of the co-axial lines of the oscillator to produce the optimum phase relationship between the feedback signal and the signal at the plate of the triode.

For a more specific appreciation of my invention, reference should be had to FIGURE 1 of the drawings which shows a high frequency oscillator 10 having an elongated cylindrical outer conductor or shell 12. A high frequency vacuum tube 14, having an anode pin 16, a grid ring 18, a cathode ring 20, and heater pins 22 is concentrically positioned in end 12*a* of the outer conductor 12.

End 12*a* of outer conductor 12 is formed with an internal annular shoulder 24 for accommodating a tube retaining ring 26. The cathode ring 20 of tube 14 is seated in a recess formed in the retaining ring 26 and a tube retaining nut 28 in threaded engagement with the inner bore of outer conductor 12 at end 12*a* is screwed down against the cathode ring 20 to rigidly clamp the tube 14 in place.

The other end 12*b* of outer conductor 12 is internally formed with an annular shoulder 30 to accommodate an insulating end plug 32. End plug 32 is retained in place against annular shoulder 30 by the advancement of one or more set screws 34 through outer conductor 12 and against end plug 32.

End plug 32, when in place, serves to mount a tuning plunger 36 concentrically within outer conductor 12. Tuning plunger 36 is of the non-contacting type and is appropriately dimensioned so as to function as a radio frequency choke. As such, tuning plunger 36 functions to confine the RF fields developed in the oscillator 10 and prevent leakage of RF energy beyond the inner end 36*a*.

End plug 32 is centrally recessed at 38 and includes a central bore 40 through which a tuning screw 42 projects through and into threaded engagement with the tuning plunger 36. In order to insure concentric alignment of the tuning plunger 36 within the outer conductor 12, guide rods 44 and 46 integrally formed with the plunger 36 project through holes 48 and 50 provided in end plug 32. An annular lock nut 52 in threaded engagement with the central recess 38 in end plug 32 is advanced inwardly into engagement with the head of tuning screw 42 urging the latter inwardly against a bowed washer 54 to clamp the tuning plunger 36 at the desired axial position.

In order to adjust the axial position of the tuning plunger 36 and thus tune the oscillator 10, tuning screw 42 is rotated in the appropriate direction to vary the position of the end 36*a* of plunger 36. As seen in FIGURE 1, the rotational motion of tuning screw 42 is translated into axial movement of the tuning plunger 36 by the threaded engagement of the end portion of the tuning screw in a central threaded bore formed in an elongated, concentrically oriented sliding line member 58 integrally affixed to the tuning plunger.

The inner end 58*a* of the sliding line member 58 is formed having an axial bore 60. An electrically conductive plate line member 62 in electrical engagement with the anode pin 16 of tube 14 is received in bore 60 of stem 58 and makes sliding electrical contact therewith.

One of the guide pins, for example, guide pin 44 in FIGURE 1, is elongated, whereupon its outer end is formed as a terminal post 64 to which circuit connection is made to a $B^+$ supply source. The $B^+$ operating voltage is thus communicated to the plate pin 16 of triode 14 through guide pin 44, plunger 36, member 58 and plate line member 62. Since end plug 32 is formed of insulating material, this D.C. path for the $B^+$ supply is electrically isolated from the outer conductor 12.

A grid sleeve 66 in the form of a tube of conducting material is mounted concentrically on tube 14 in electrical contact with the grid ring 18. The grid sleeve 66 in combination with the members 58 and 62 form a plate-grid co-axial line 67, and at the same time, physically cooperates with the outer conductor 12 to form a grid-cathode co-axial line 69. The grid ring 18 of tube 14 is coupled to the cathode ring 20 through grid resistor 68 connected between grid sleeve 66 and cathode ring 20 to provide a D.C. return. The cathode ring 20 is electrically connected to the outer conductor 12 through the D.C. path provided by the tube mounting elements 26 and 28. The outer conductor 12 is in turn electrically grounded.

In order to extract usable electrical energy from the oscillator 10, an output co-axial connector 78 projects through the outer conductor 12 and is retained in place by a set screw 70 advanced through the side wall of a collar 72 integrally formed with the outer conductor 12. The inner conductor of output co-axial connector 78 is formed at its inner end with a probe 74 to capacitively couple electrical energy from the grid-cathode co-axial line 69.

In accordance with my invention and as seen in FIGURE 1, a dielectric slug 76 in the form of a cylinder of empirically determined length is disposed to completely fill the space between the grid sleeve 66 and the outer surface of the sliding line member 58. The reason for the inclusion of the dielectric slug 76 as heretofore generally stated will hereinafter be demonstrated by consideration of a specific example. It is understood that my invention is not limited to the specific example disclosed but is applicable to other re-entrant type oscillators having different physical dimensions, and designed to operate at other than the disclosed operating frequency.

First of all, assume that it is desired to design a triode oscillator for operation at a frequency of 4500 megacycles. The selection of a particular tube is not important except that it must be capable of operating at this frequency. Assume also that the size of the tube is such that a grid sleeve 66 having an outside diameter of 0.375 inch will just fit over and electrically engage the grid ring 18 and that the tube 14 is to be inserted within an outer conductor or shell 12 having an inner diameter of 0.495 inch.

The first step is to operate the selected tube in a wave guide section at the desired operating frequency as an amplifier and measure the amount of gain and also the output power capabilities of the tube. The tube is also operated as an oscillator in a wave guide section at 4500 megacycles and a measurement of the power developed in the plate cavity and the power fed back to the grid is taken. Assume that these values were found to be 300 milliwatts and 100 milliwatts, respectively.

It can be shown that if the ratio of the characteristic impedances of the grid-plate co-axial line 67 and the grid-cathode co-axial line 69 of a re-entrant type oscillator is proportional to the ratio of the square roots of these values of power, the feedback signal amplitude is at its optimum value.

For the specific situation, the ratio of the characteristic impedance of the grid-plate co-axial line and the characteristic impedance of the grid-cathode co-axial line of a re-entrant type oscillator is calculated as follows:

$$\frac{Z_{ogp}}{Z_{ogk}}=\frac{\sqrt{300}}{\sqrt{300}}=1.73$$

where $Z_{ogp}$=characteristics impedance of grid-plate line
$Z_{ogk}$=characteristic impedance of grid-cathode line.

Since we have already determined the desired dimensions of the grid sleeve 66 and the outer conductor 12 which cooperate to define the grid-cathode co-axial line 69, the characteristic impedance of this co-axial line may be computed as follows:

$$Z_{ogk}=60\ \ln\frac{.495}{.375}=16.6\text{ ohms}$$

The characteristic impedance of the grid-plate co-axial line may then be calculated out to be $$Z_{ogp}=1.73\times 16.6=28.7\text{ ohms}$$

Therefore, in order to obtain the optimum value of feedback signal amplitude in this specific situation, the grid-plate co-axial line 67 should be designed to have a characteristic impedance of 28.7 ohms.

In order to obtain optimum oscillatory signal re-generation, the total effective phase shift from plate to grid should be 180°. It now remains to determine the phase shift from plate to grid in the specific example. Assuming that we desire the tube to operate over the frequency range from 4250 megacycles to 4800 megacycles, the geometrical means frequency of this frequency range is calculated out as follows:

$$\sqrt{(2\times 4.25)(2\times 4.8)}\times 10^9=4.52\times 10^9 \text{ cycles per second}$$

Beginning at the tube terminals we desire to determine the location of the first voltage minimum of the standing waves in each of the co-axial lines of the re-entrant type oscillator. This can be determined by using the following formula:

$$X_c=Z_0 \tan B1$$

where $X_c$ equals the interelectrode capacitive reactance of the particular tube;

$Z_0$ equals the characteristic impedance of the co-axial line under consideration; and B equals the rate of change of phase angle per unit distance, often called the phase constant.

Substituting the known values of $X_c$, $Z_0$ and B for the grid-plate co-axial line in the above equation and solving for 1, $$\tan B1=\frac{X_c}{Z_{gp}}=\frac{35}{28.7}=1.22$$

$$=50.7°$$

$$B=138°/\text{inch}$$

$$\therefore 1=0.368 \text{ inch}$$

The distance from the tube 14 along the grid-plate co-axial line 67 to the first voltage minimum is found to be 0.368 inch in the specific example. From this first voltage minimum to the first voltage maximum in the grid-plate co-axial line 67 is an additional 0.655 inch which is a quarter wavelength in air at 4520 megacycles. Therefore, the length of the grid-plate co-axial line 67 from the tube terminals to the first voltage maximum figures out to 0.368 plus 0.655 inch or 1.023 inches. This then should be the length of the grid-plate co-axial line 67, or, in other words, the interior length of the grid sleeve 66 in FIGURE 1.

Using the same formula, we may also calculate the length of the grid-cathode co-axial line 69 as seen below.

$$\tan B1=\frac{X_c}{Z_{gk}}=\frac{12}{16.6}=36°$$

$$1=\frac{36°}{138°/\text{inch}}=0.262$$

We therefore see that the length of the grid-cathode co-axial line 69 calculates out to 0.262 plus 0.655 or 0.917 inch while the length of the grid-plate co-axial line calculates out to 1.023 inches. The difference in these two lengths represents a phase error of 14.6°. It can thus be seen that, in my specific example, I am faced with the anomalous physical situation where the grid sleeve 66 of FIGURE 1 should be longer in the grid-plate co-axial line 67 than it is in the grid-cathode co-axial line 69. It is understood that, for optimum coupling of radio frequency energy between the grid-plate and grid-cathode co-axial lines, the voltage maximums of the energy in each should occur rather precisely at the free end of the grid sleeve 66.

I have found that by dielectrically loading the oscillator through the inclusion of the dielectric slug 76 of FIGURE 1 in the grid-plate co-axial line 67, I can substantially overcome this situation. Thus, if the slug 76 has an appropriate dielectric constant and is properly dimensioned, I can make the grid-plate co-axial line 67 longer electrically and shorter physically. This may be accomplished since a dielectric has the property of slowing down the velocity of propagation of electrical energy. In other words, the velocity of propagation of electrical energy in a dielectric is slower than it is in air. Specifically, the velocity of propagation of electrical energy in a dielectric is inversely proportional to the square root of the dielectric constant. Therefore, with a dielectric constant of 4, for example, the velocity of propagation of electrical energy is one-half as fast as it is in air which has a dielectric constant of substantially 1. This, in effect, doubles the value of the phase constant B. Thus, the wavelength of electrical energy propagating in a dielectric may be fore-shortened to the precise extent necessary to cause a voltage maximum to occur in the grid-plate co-axial line 67 at a point coinciding with the end of the grid sleeve 66.

Since the foregoing calculations for the specific example have neglected fringing effects and the differences between the actual mean-free path and the idealized mean-free path of the propagating electrical energy, it is more practical to determine the proper dimensions and dielectric constant of the dielectric slug 76 empirically rather than mathematically. Therefore, the recommended procedure is to begin with a dielectric slug 76 of low dielectric constant and progressively substitute slugs of higher dielectric constants until an optimumly matched opertaing condition is achieved. In addition, it may also be necessary to vary the length of the dielectric slug 76 to provide a more precise adjustment of the operating condition of the oscillator.

By dielectrically loading a re-entrant type oscillator 10 such as shown in FIGURE 1, I have found that the operating efficiency in both the pulsed and continuous wave operational modes is improved substantially, and in fact, may be in excess of 100 percent improvement over oscillators which are not dielectrically loaded in accordance with my invention. In addition, the improvement in the output power in both the pulsed and continuous wave operational modes may, in some re-entrant oscillators, be as high as 100 percent. It will be appreciated that this improvement in efficiency and output power is most dramatic in physically small re-entrant oscillators operating at frequencies in excess of 4000 megacycles. As was noted above in the case of larger re-entrant oscillators operating at lower frequencies, the relationship of feedback signal amplitude and phase is susceptible to compromise and therefore, the application of my invention to achieve an optimumly matched operating condition in these oscillators does not achieve as marked an improvement as in the smaller, high frequency re-entrant oscillators. Thus, my invention has its greatest significance when incorporated in oscillators of very small physical size, but is quite useful in re-entrant oscillators of larger physical size, nonetheless.

It will thus be seen that the objects set forth above, among those made apparent from the preceding description are efficiently attained, and since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Having described my invention, what I claim as new and desire to secure by Letters Patent is:

1. An ultra-high frequency re-entrant oscillator comprising, in combination (A) a triode having plate, grid, and cathode terminals;

(B) a first elongated conductor electrically connected to said plate terminal;

(C) a second elongated-conductor electrically connected to said cathode terminal;

(D) a third elongated conductor disposed intermediate said first and second conductors, said third conductor (1) electrically connected to said grid terminal, (2) physically cooperating with said first conductor to define a first distributed parameter co-axial line, and (3) physically cooperating with said second conductor to define a second distributed parameter co-axial line, (a) said first and second co-axial lines electrically coupled together to provide a feedback for radio frequency feedback energy effective to sustain regenerative oscillatory operation of said triode; and (E) dielectric means positioned in one of said first and second co-axial lines, (1) said dielectric means altering the electrical length of said one co-axial line without altering the physical length thereof, (2) whereby to optimize the electrical characteristics of said feedback energy propagated through said dielectric means.

2. The device claimed in claim 1 wherein said dielectric means is in the form of a slug of dielectric material, said dielectric material having a dielectric constant greater than that of air.

3. The device claimed in claim 2 wherein said slug of dielectric material is positioned in said first co-axial line.

4. An ultra-high frequency re-entrant oscillator comprising, in combination (A) a triode having plate, grid and cathode terminals;

(B) a first elongated conductor electrically connected to said plate terminal;

(C) a second elongated conductor electrically connected to said cathode termial;

(D) a third elongated conductor disposed intermediate said first and second conductors, said third conductor (1) electrically connected to said grid terminal, (2) cooperating with said first conductor to define a first co-axial line, and (3) cooperating with said second conductor to define a second co-axial line;

(E) said first and second co-axial lines electrically coupled together to form, in combination, a feedback path for radio frequency feedback energy effective to sustain regenerative oscillatory operation of said triode;

(F) the characteristic impedances of said first and second co-axial lines being such as to provide an optimum value of feedback energy amplitude to said triode; and (G) dielectric means inserted in one of said first and second co-axial lines to provide a propagation medium for said feedback signal effective to alter the electrical length of said one-axial line without altering the physical length thereof such as to provide optimum feedback energy phase to said triode.

5. The device defined in claim 4 wherein said third conductor is a tubular member having a free end remote from said triode, (1) said member defining the physical dimensions of said first and second co-axial lines, (2) said member having a physical length such that said free end thereof is situated at a point of maximum voltage for the feedback energy waveform in said second co-axial line, (3) said dielectric inserted in said first co-axial line and serving to shift the location of the voltage maximum of the feedback energy waveform in said first co-axial line to the location coinciding with said free end of said member.

6. An ultra-high frequency re-entrant oscillator comprising, in combination, (A) a co-axial outer conductor (B) a co-axial inner conductor (C) a tube mounted within one end of said co-axial outer conductor (1) a cathode terminal of said tube electrically connected to said co-axial outer conductor and (2) a plate terminal of said tube electrically connected to the co-axial inner conductor (D) an elongated tubular sleeve member (1) co-axially aligned between said co-axial outer conductor and said co-axial inner conductor and, in combination therewith, defines (a) a grid-plate co-axial line and (b) a grid-cathode co-axial line, (2) electrically connected at one end to a grid terminal of said tube, (3) the other end of said sleeve member serving to define the physical lengths of said grid-plate co-axial line and said grid-cathode co-axial line, (E) dielectric means positioned in said grid-plate co-axial line to increase the electrical length thereof without a corresponding increase in the physical length thereof, (1) whereby to optimize the characteristics of feedback energy propagating through said dielectric means and coupled from said grid-plate co-axial line to said grid-cathode co-axial line by the presence of said tubular sleeve member for regenerative oscillatory operation of said triode.

7. The device claimed in claim 6 being tuned to operate at a frequency in excess of 4000 megacycles per second.

References Cited by the Examiner

UNITED STATES PATENTS

| | | | |
|---|---|---|---|
| 2,421,784 | 6/1947 | Haeseler et al. | 333—82 X |
| 2,451,825 | 10/1948 | Guarrera | 331—98 |
| 2,605,421 | 7/1952 | Schultz et al. | 331—98 |

FOREIGN PATENTS

| | | |
|---|---|---|
| 708,833 | 5/1954 | Great Britain. |

J. B. MULLINS, *Assistant Examiner.*

ROY LAKE, *Primary Examiner.*

UNITED STATES PATENT OFFICE

CERTIFICATE OF CORRECTION

Patent No. 3,278,859 October 11, 1966

Benjamin F. Gregory

It is hereby certified that error appears in the above numbered patent requiring correction and that the said Letters Patent should read as corrected below.

Column 4, line 49, for "300" read -- 100 --; line 51, for "characteristics" read -- characteristic --; column 5, line 1, for "means" read -- mean --; column 7, line 6, before "for" insert -- path --; line 51, for "one-axial" read -- one co-axial --.

Signed and sealed this 5th day of September 1967.

(SEAL)
Attest:

ERNEST W. SWIDER
Attesting Officer

EDWARD J. BRENNER
Commissioner of Patents